US008274408B2

(12) United States Patent  (10) Patent No.: US 8,274,408 B2
Liang  (45) Date of Patent: Sep. 25, 2012

(54) USB KEYBOARD ARRANGEMENT HAVING N-KEYS ROLLOVER AND THE METHOD THEREOF

(76) Inventor: Hui-Hu Liang, Changhua Hsien (TW)

( * ) Notice: Subject to any disclaimer, the term of this patent is extended or adjusted under 35 U.S.C. 154(b) by 203 days.

(21) Appl. No.: 12/426,234

(22) Filed: Apr. 18, 2009

(65) Prior Publication Data

US 2011/0006927 A1    Jan. 13, 2011

(51) Int. Cl.
    *H03K 17/94*    (2006.01)
(52) U.S. Cl. ............... 341/22; 341/20; 341/24; 341/25; 345/168; 345/173; 710/67; 710/73
(58) Field of Classification Search ............. 341/20–35; 345/168, 173; 710/67, 73
    See application file for complete search history.

(56) References Cited

U.S. PATENT DOCUMENTS

2007/0266188 A1* 11/2007 Chen .............................. 710/67
2010/0073204 A1*  3/2010 Tsao et al. ..................... 341/26

OTHER PUBLICATIONS

Title: Device Class Definition for HID, Date: Apr. 7, 1999, Publisher: www.usb.org, Version: 1.1, pp. 60.*

* cited by examiner

*Primary Examiner* — George Bugg
*Assistant Examiner* — Franklin Balseca
(74) *Attorney, Agent, or Firm* — Jackson IPG PLLC

(57) ABSTRACT

A USB keyboard arrangement having N-keys rollover and the method thereof mainly make use of rearranging a keycode of a firmware program of the USB keyboard through sets of bit maps to control each key thereon. After modifying a matrix, each key within a certain key-area can favorably avert from key ghosting existed in the matrix circuit. Therefore, when all keys in the key-area are concurrently pressed, isolated signals of the keys can be simultaneously sensed. While alternatively adjusting the firmware program through the above methods and adapting the methods to the prior art to split the keys in the key-area of the matrix from the crosspoints of key ghosting, the key-area of the USB keyboard can be provided with concomitantly sending isolated signals.

11 Claims, 6 Drawing Sheets

|     | Y0 | Y1 | Y2 | Y3 | Y4 | Y5 | Y6 | Y7 |
|-----|----|----|----|----|----|----|----|----|
| X0  | Z | ! 1 | Flip 3D | Pre track | ALT-R | Next track | Webcam | Message status |
| X1  | C | # 3 | Photo Gallery | Vol+ | Vol- | WWW Refresh | Ctrl-R | Message |
| X2  | V | F1 | F5 | WWW Back | ALT-L | WWW Forward | WWW stop | WWW Search |
| X3  | Enter | F2 | F6 | Audio1 | Audio2 | Shift-L | Audio3 | WWW Favorite |
| X4  | Esc | F3 | Pause | Power point | Excel | Word | Ctrl-L | Mail |
| X5  | Space | $ 4 | K56 | Win-L | WWW Home | N-CHG (K131) | CHG (K132) | ROMA (K133) |
| X6  | Tab | F4 | K14 | Caculator | Sleep | KOR1 (K150) | KOR2 (K151) | Win-R |
| X7  | A | ~ \ | F7 | Y | End | & 7 | : ; | Num Lock |
| X8  | S | — - | F8 | U | { [ | * 8 | H | N |
| X9  | D | + = | F9 | I | } ] | ( 9 | " , | K45 |
| X10 | W | Back-Space | F11 | Print Screen | Home | Delete | Insert | > . |
| X11 | E | L | F12 | Scroll Lock | P | Pgup | K42 | ? / |
| X12 | Q | J | F10 | O | \| \ (K29) | ) 0 | PgDn | < , |
| X13 | APP | G | ⇑ | B | 7 (pad) | 4 (pad) | 1 (pad) | Caps Lock |
| X14 | F | % 5 | / (pad) | ⇐ | 8 (pad) | 5 (pad) | 2 (pad) | 0 (pad) |
| X15 | R | ^ 6 | * (pad) | 9 (pad) | ⇓ | 6 (pad) | 3 (pad) | . (pad) |
| X16 | T | K | - (pad) | + (pad) | K107 | ⇒ | Enter (pad) | M |
| X17 | X | @ 2 | Lock | Play / Pause | Media Select | Shift-R | Media Mute | Media Stop |

| Byte | Description |
| --- | --- |
| 0 | Modifier keys |
| 1 | Reserved |
| 2 | Keycode 1 |
| 3 | Keycode 2 |
| 4 | Keycode 3 |
| 5 | Keycode 4 |
| 6 | Keycode 5 |
| 7 | Keycode 6 |

Fig. 1-A
PRIOR ART

| Bit | Description |
| --- | --- |
| 0 | NUM LOCK |
| 1 | CAPS LOCK |
| 2 | SCROLL LOCK |
| 3 | COMPOSE |
| 4 | KANA |
| 5 to 7 | CONSTANT |

Fig. 1-B
PRIOR ART

|     | Y0 | Y1 | Y2 | Y3 | Y4 | Y5 | Y6 | Y7 |
|-----|----|----|----|----|----|----|----|----|
| X0  | Z | ! 1 | Flip 3D | Pre track | ALT-R | Next track | Webcam | Message status |
| X1  | C | # 3 | Photo Gallery | Vol+ | Vol- | WWW Refresh | Ctrl-R | Message |
| X2  | V | F1 | F5 | WWW Back | ALT-L | WWW Forward | WWW stop | WWW Search |
| X3  | Enter | F2 | F6 | Audio1 | Audio2 | Shift-L | Audio3 | WWW Favorite |
| X4  | Esc | F3 | Pause | Power point | Excel | Word | Ctrl-L | Mail |
| X5  | Space | $ 4 | K56 | Win-L | WWW Home | N-CHG (K131) | CHG (K132) | ROMA (K133) |
| X6  | Tab | F4 | K14 | Caculator | Sleep | KOR1 (K150) | KOR2 (K151) | Win-R |
| X7  | A | ~ \ | F7 | Y | End | & 7 | : ; | Num Lock |
| X8  | S | — - | F8 | U | { [ | * 8 | H | N |
| X9  | D | + = | F9 | I | } ] | ( 9 | " , | K45 |
| X10 | W | Back-Space | F11 | Print Screen | Home | Delete | Insert | > . |
| X11 | E | L | F12 | Scroll Lock | P | Pgup | K42 | ? / |
| X12 | Q | J | F10 | O | \| \ (K29) | ) 0 | PgDn | < , |
| X13 | APP | G | ⇑ | B | 7 (pad) | 4 (pad) | 1 (pad) | Caps Lock |
| X14 | F | % 5 | / (pad) | ⇐ | 8 (pad) | 5 (pad) | 2 (pad) | 0 (pad) |
| X15 | R | ^ 6 | * (pad) | 9 (pad) | ⇓ | 6 (pad) | 3 (pad) | (pad) |
| X16 | T | ` | - K | + (pad) | K107 (pad) | ⇒ | Enter (pad) | M |
| X17 | X | @ 2 | Lock | Play / Pause | Media Select | Shift-R | Media Mute | Media Stop |

Fig. 5

USB KEYBOARD ARRANGEMENT HAVING N-KEYS ROLLOVER AND THE METHOD THEREOF

BACKGROUND OF THE INVENTION

1. Field of the Invention

The present invention relates to a USB keyboard, in particularly to the USB keyboard arrangement having N-keys rollover and the method thereof.

2. Description of the Related Art

Generally, the steps of detecting ghost key condition of a matrix keyboard in a square circuit are applicably shown in FIGS. 1 and 2 as following steps of:

1. Constrainedly pressing a key SW-A while a scanning line L1 outputs a high voltage H1 as well as a scanning line L2 outputs a low voltage LOW and sensing if a first node Node 1 is directed to the low voltage LOW;
2. Keeping on continuously and constrainedly pressing a key SW-B and observing a second node Node 2 located in the low voltage LOW for the Node 2-1 to be directed to the low voltage LOW;
3. Sensing a third node Node 3 to be directed to the low voltage LOW when a key SW-C is continuously and constrainedly pressed;
4. Sensing a fourth node Node 4 to be directed to the low voltage LOW without pressing a key SW-D, whereby displaying the signal of the key SW-D on a monitor.

By the above detecting steps, the keys SW-A, -B, -C, and -D on four corner of the square circuit are in a clockwise distribution started from the left-top orientation. Wherein, when the keys SW-A, -B, and -C are pressed simultaneously, the key SW-D is also actuated so that signals of four keys are displayed. However, the key SW-D is actually not pressed, and this is the so-called "key ghosting". That is, once the keys SW-A to -D are placed within a four-crosspoint-array, a ghost key condition is inevitably incurred while only three keys are pushed to actuate.

Accordingly, there are two conventional methods to obviate the ghost key condition;

1. Firmware Program:

Referring to FIG. 3, when at least three keys are concurrently pressed, the firmware program distinguishes a ghost key condition and determines not to admit the input of the keys. The program differentiates the input of the keys only when the ghost key condition is obviated. That is to say, the input during the ghost key condition is read as null, which readily incurs a void command while the user enters a coming command.

2. Increasing Diode:

Referring to FIG. 4, showing four keys SW-A, B, C, and D are respectively connected to scanning lines L1 and L2 as well as spy lines S1 and S2 within the matrix circuit of the keyboard. Wherein, the inputting ends of the keys are correspondingly contacted with diodes D1, D2, D3, and D4, and the detecting steps are as follows:

1. When the scanning line L1 sends a signal of high voltage H1, the scanning line L2 sends a signal of low voltage LOW, and the key SW-A is constrainedly pressed, the first node Node 1 is distinguished as a signal of low voltage LOW;
2. When the key SW-B is continuously pressed and the second node Node 2 is distinguished as a signal of low voltage LOW, but Node 2-1 is distinguished as a signal of high voltage as a result of the non-communication of the diode D2 caused by the voltage differentiation between input and output ends of the diode D2 being below 0.6 V;
3. When the key SW-C is continuously pressed, the third node Node 3 is differentiated as a signal of high voltage.
4. Herein, the fourth node Node 4 is differentiated as a signal of high voltage without pressing the key SW-D. Therefore, no ghost key condition is observed.

Accordingly, the second method can preferably obviate the key ghosting. However, every key has to be supplied with a diode, which attends a burden of producing cost.

In addition, as shown in FIGS. 1A and 1B, there is a limitation on a Qwerty because of a standard regulation defined on a USB keyboard (as indicated in FIG. 1A). That is to say, the keyboard has to send eight bytes of keycodes to the system according to following rationales:

The first byte (0 byte): the bit map is modified by modifier key, and each bit presents a key; accordingly, there are eight keys (two symmetrical Shifts, Ctrls, Alts, and Wins as shown in FIG. 1B).

The second byte (1 byte): not defined.

The third byte to the eighth byte (2-7 byte), totally six bytes: normal keys are modified, and each byte presents a key; whereby, there are six keys. However, because of the above limitation of standards, the USB keyboard is still limited to send six normal keys at a time even if the general USB keyboard can obviate ghost key condition.

Therefore, the possibility of combining the aforementioned conventional arts with the standard USB keyboard may be accepted, in which as a matter of fact the method of increasing diodes between the key circuit preventing key ghosting can only solve the limitation of standards by expanding the restricted key areas of the USB keyboard to the entire keys thereof. That is to say, in view of the standard firmware of keycode, the concurrent differentiation can only limitedly occurs on simultaneously pressing eight modifier keys and six normal keys although such combination may obviate the problem of ghost key condition.

SUMMARY OF THE INVENTION

The object of the present invention is to provide a USB keyboard arrangement to remove the current limitation of the circumventing key ghosting which merely sends signals of maximal six keys at a same time.

The USB keyboard arrangement having N-keys rollover in accordance with the present invention essentially provide a firmware program of a USB Qwerty keycode to be rearranged by multiple sets of bit map to control each key, whereby disposing the keys into at least one key-area. Moreover, each key of the certain key-area is designed to escape from crosspoints within a matrix circuit, so that at least six normal keys can simultaneously send at least six isolated signals.

The USB keyboard arrangement having N-keys rollover and the method thereof comprising steps of:

a. Adapting a descriptor of USB to a bit map for each bit of a byte to present a key and for each byte to present eight keys, whereby rearranging and redefining the keys through sets of bytes.

b. Placing each key of the modified arranging area on a non key ghosting position to prevent the ghost key condition.

Base on the conventional aforementioned prior arts, the present invention applies to modify the firmware program of the first typical method and to adapt the program to the second typical method feature of the elimination of the ghost key condition, the entire key-area of the USB keyboard thus can be provided with simultaneously sending isolated signals.

Therefore, the N-Keys Rollover can support the entire key-area of the USB keyboard, and the key-area would not be limited via the method of the present invention.

The advantages of the present invention over the known prior arts will become more apparent to those of ordinary skilled in the art by reading the following descriptions with the relating drawings.

BRIEF DESCRIPTION OF THE DRAWINGS

FIG. 1A is a brief table showing an input form of every byte of the Qwerty USB keyboard;

FIG. 1B is a brief table showing an output form of every bit of the USB Qwerty keyboard;

FIG. 5 is a schematic table showing the rearranged matrix of the present invention.

DETAILED DESCRIPTION OF THE PREFERRED EMBODIMENTS

Figure 1:
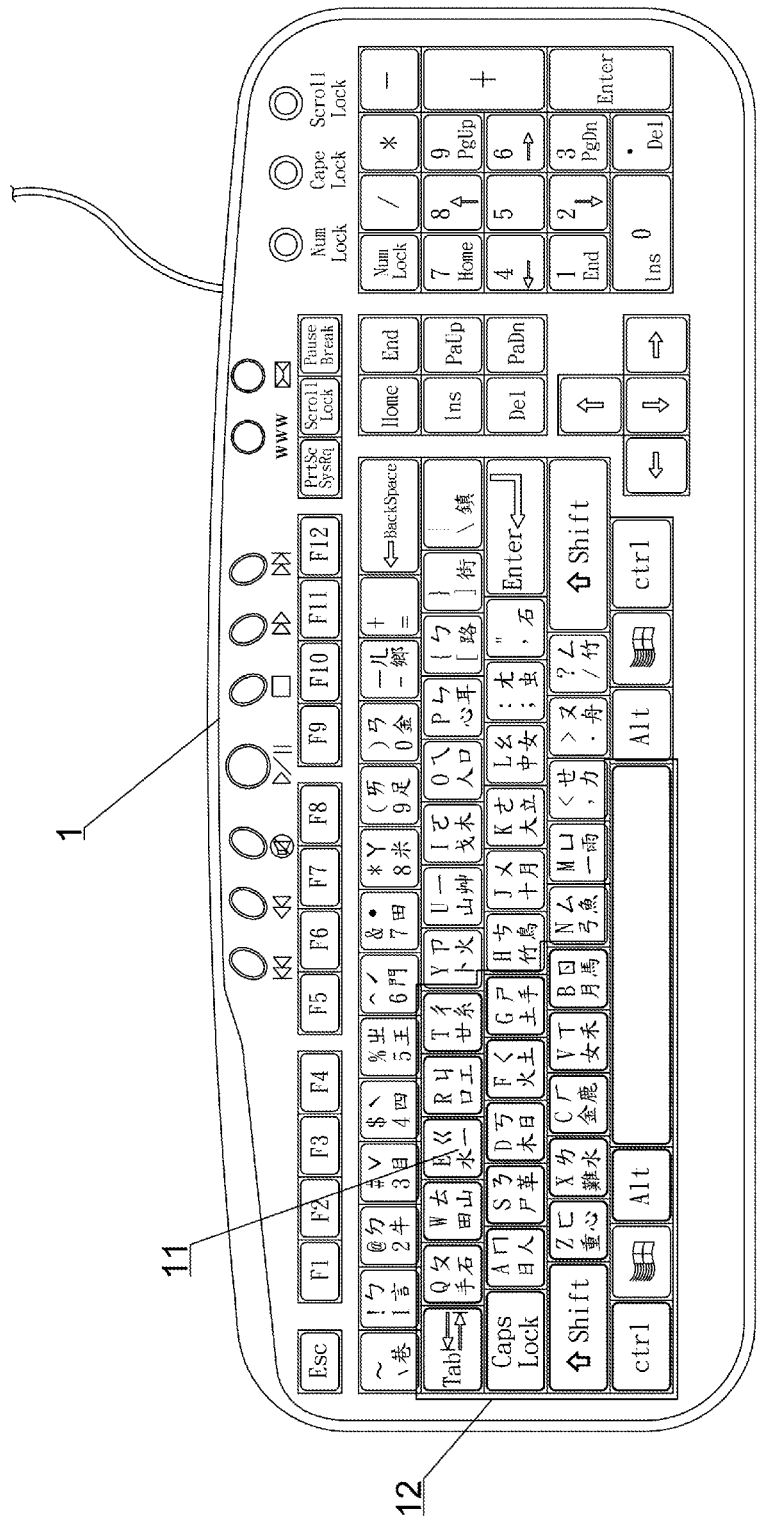
FIG. 1 is a schematic view of a Qwerty USB keyboard.

Before describing in greater detail, it should note that the like elements are denoted by the similar reference numerals throughout the disclosure.

Referring to FIGS. 1 and 5 showing the methods of USB keyboard arrangement having N-keys rollover modified by firmware program comprises the following steps of:
1. Adapting a USB report descriptor to a bit map, wherein, each bit presents a key, and a byte presents eight keys so as to redefine normal keys through the bit map; and
2. Enabling end points of the USB to apply multiple reports in type as follows:
    a. Use a keyboard shorter than a USB QWERTY keyboard to send eight bytes of keycodes to conform with a standard driver of windows OS.
    b. The normal keys of the USB keyboard are divided into sets of reports in type, and the length of each keycode does not exceed eight bytes (as shown in FIG. 1B).
    c. The keys are rearranged within the matrix circuit (as shown in FIG. 5). As a result, while all of the keys in the key-areas are simultaneously pressed (as shown in FIG. 1), they would not output signals on the crosspoints of the rectangular matrix circuit concurrently (as shown in FIG. 2) to circumventing key ghosting.

The subsequent description depicts the preferred embodiment of the present invention:

Keys 11 of a USB keyboard 1 have a standard arrangement of QWERTY, and the key-area 12 is not limited to a certain area of the keyboard. Herein this embodiment, the key-area 12 is directed to the area that is circled by dotted lines in FIG. 1. The firmware program is modified to multiple reports in type, and each report is announced by a bit map. Wherein, the keys arranged on the key-area 12 are placed on the crosspoints of a matrix circuit where no key ghosting is responded. For example, the keys are directed to the matrix (X0~X2, Y0) intersected by components of Z, C, V in sequence; the key on the crosspoint of matrix (X3, Y5) is directed to Shift-L; the key on the crosspoint of matrix (X4, Y6) is directed to Ctrl-L; the keys on the crosspoints of matrix (X5~12, Y0) are directed to Space, Tab, A, S, D, W, E, and Q in sequence; the keys on the crosspoints of matrix (X14~17, Y0) are directed to F, R, T, and X; the keys on the crosspoints of matrices (X13, Y1), (X13, Y3), and (X13, Y7) are directed to G, B, and CapsLock.

Figure 2:
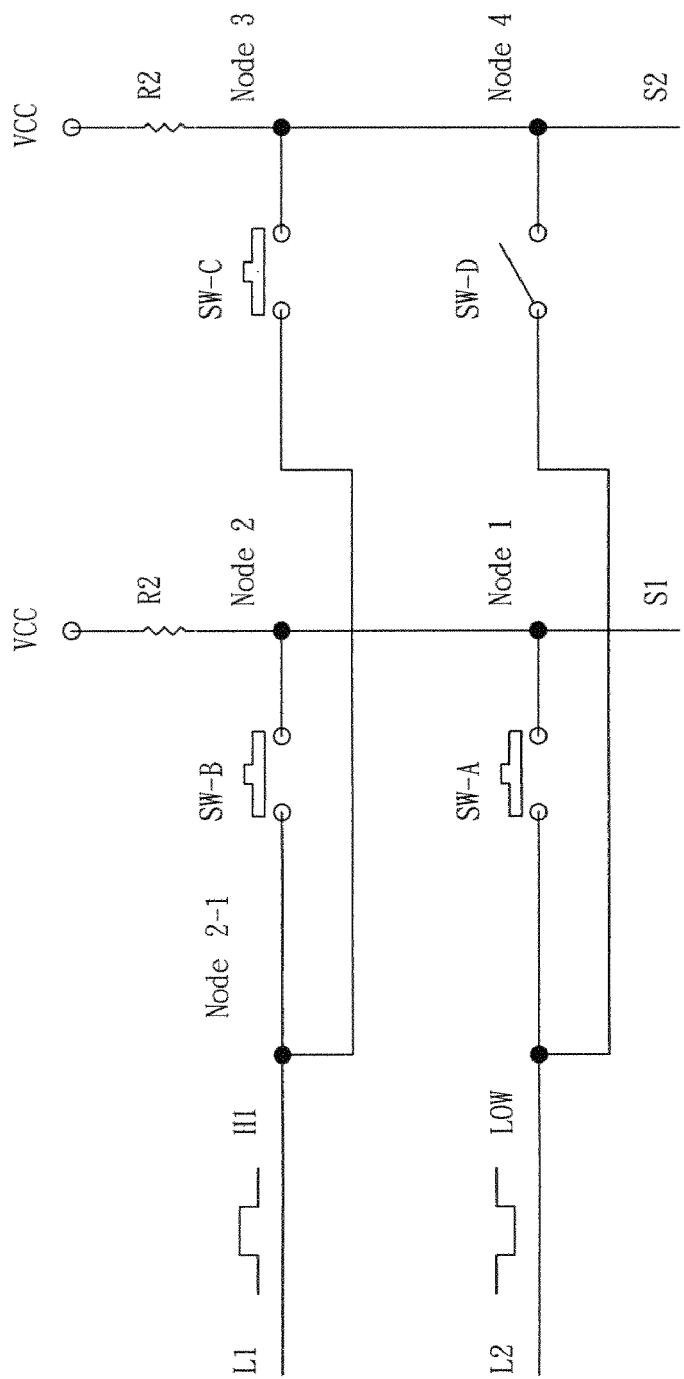
FIG. 2 is a diagram view showing a matrix circuit of a conventional keyboard.
Figure 3:
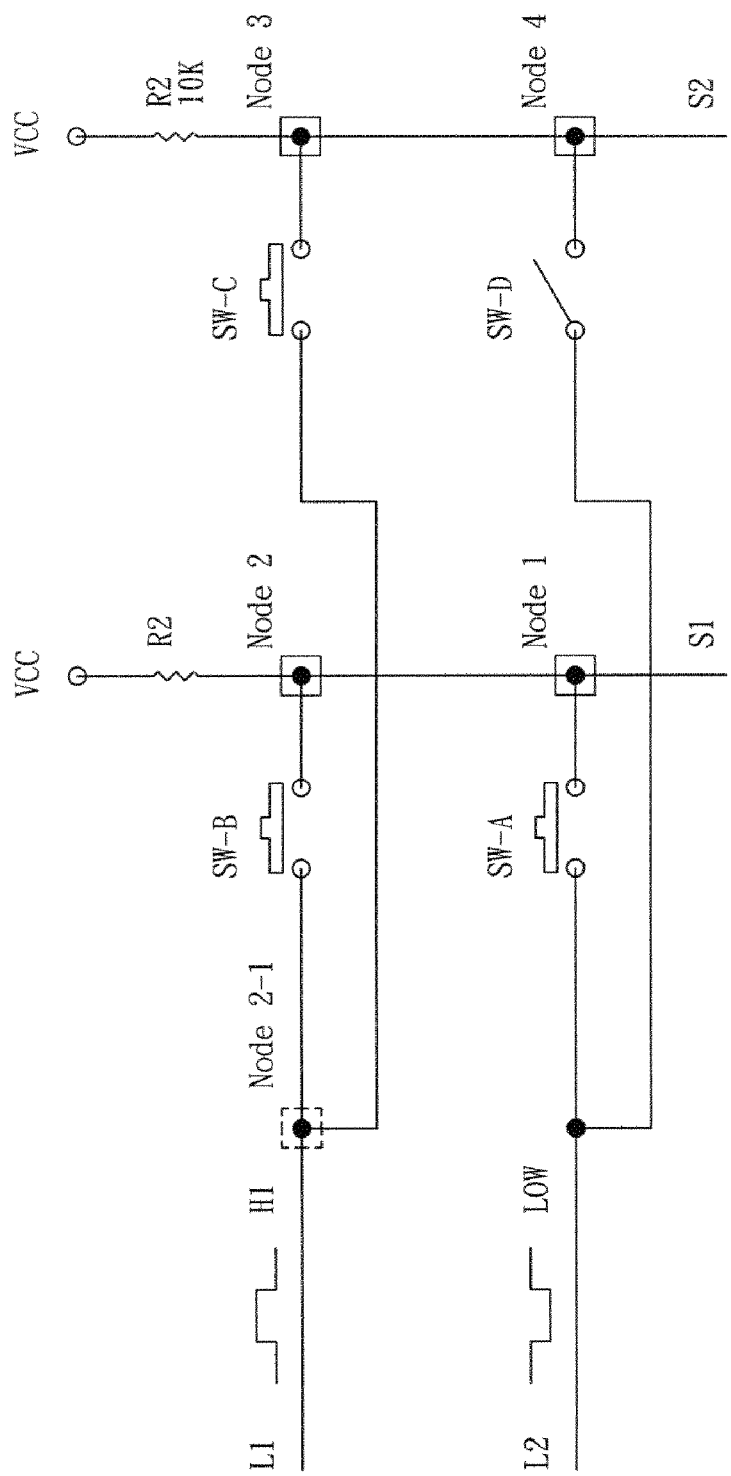
FIG. 3 is a diagram view showing the key ghosting in a conventional keyboard is solved by a conventional firmware program.
Figure 4:
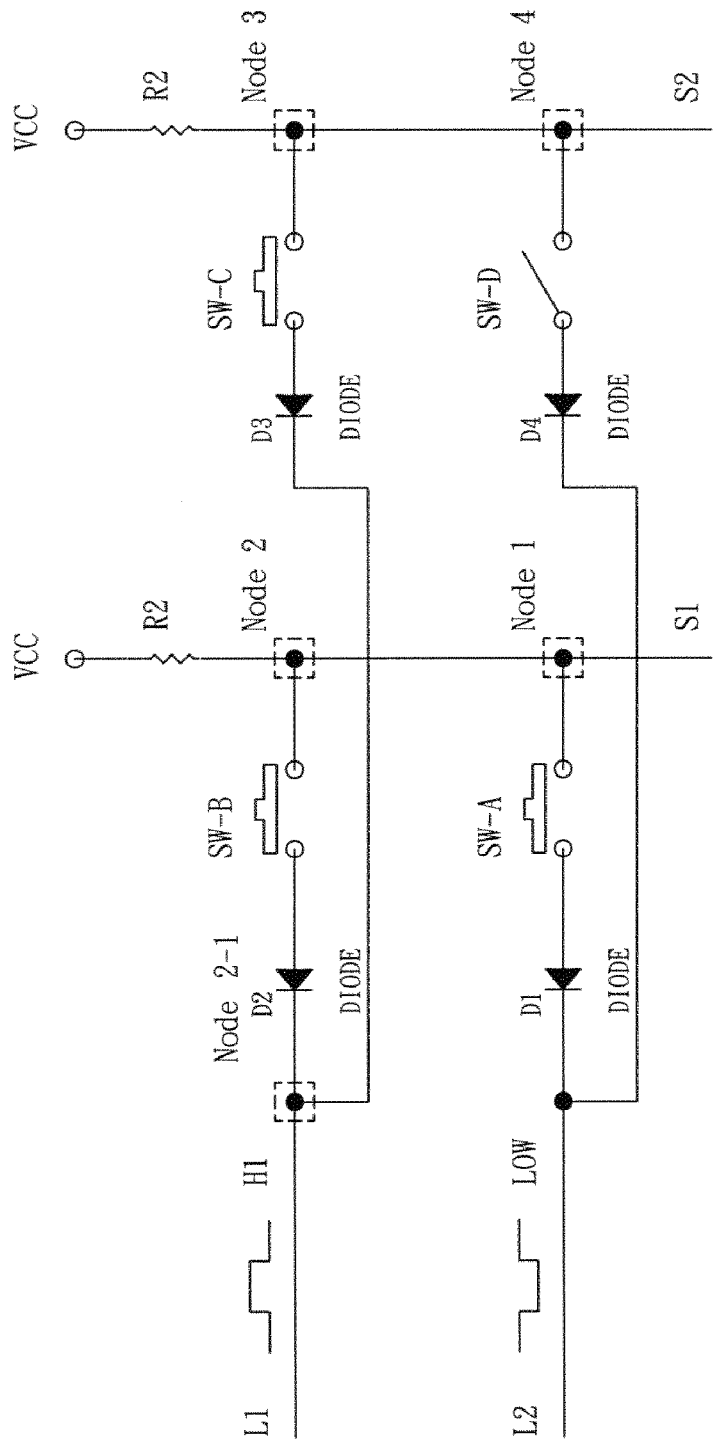
FIG. 4 is a diagram view showing the key ghosting in a conventional keyboard is solved by connections of keys and correspondent diodes.

Accordingly, while at least six keys are in the key-area of the USB keyboard shown in FIG. 1, no square crosspoints in FIG. 2 would be generated, and this can be known from the matrix of FIG. 5. Namely, all keys in the key-area are not placed in the key ghosting, which preferably prevents from ghost key condition. Alternatively, if the certain key-area of the USB keyboard is modified by keycodes, multiple reports in type having its individual bit map, various output signals can be separately sensed as N-Keys Rollover. Namely, the key-area with the modified arrangement can simultaneously send multiple signals (N-keys Rollover) for circumventing key ghosting; other area without the modified arrangement cannot simultaneously send multiple signals (N-keys Rollover) without ghost key condition. Moreover, the arrangement is not limited to be adapted in a certain area of the keyboard associated with the method of the present invention. Other key-area throughout the keyboard can also be adopted.

According to the modified-bit-map-arrangement of the present invention, the number of the reports in type is not limited; namely, the endpoint of the USB keyboard can be adapted either one or two.

Referring to FIGS. 2 and 5, a diode serially connects to each key promotes the entire keyboard to provide with merits of simultaneously sending multiple isolated signals (N-Keys Rollover) for obviating the problem of the key ghosting. Further, the key-area can be arranged either in a QWERTY or as an extension to the keyboard.

While we have shown and described the embodiment in accordance with the present invention, it should be clear to those skilled in the art that further embodiments may be made without departing from the scope of the present invention.

I claim:

1. A USB keyboard arrangement having N-keys rollover, characterized in that said USB keyboard comprising a firmware program to be modified via redefining sets of bit maps therein as corresponding keys on said keyboard and disposing said keys into at least one key-area, wherein said keys in said key-area being placed at crosspoints of a matrix circuit escaping from positions of key ghosting for said keys to simultaneously transmit multiple responsive signals.

2. The keyboard arrangement as claimed in claim 1, wherein, a USB endpoint of said key is adapted to a bit map.

3. The keyboard arrangement as claimed in claim 1, wherein, said keys are rearranged in said matrix circuit to prevent said keys from simultaneously sending signals on square crosspoints of said matrix circuit for avoiding said key ghosting.

4. The keyboard arrangement as claimed in claim 1, wherein, said redefined bit map has multiple reports in type.

5. The keyboard arrangement as claimed in claim 1, wherein, said USB keyboard can have one or two endpoints.

6. The keyboard arrangement as claimed in claim 1, wherein, said key-area can be arranged either in a QWERTY or as an extension to said keyboard.

7. The keyboard arrangement as claimed in claim 1, wherein, said key-area can be adapted in any area throughout said keyboard.

8. The keyboard arrangement as claimed in claim 1, wherein, said key-area can simultaneously output multiple key signals, and remaining keys on non-redefined areas cannot simultaneously output said multiple key signals.

9. The keyboard arrangement as claimed in claim 1, wherein, said key ghosting is prevented either by a firmware or by a hardware.

10. A USB keyboard arrangement having N-keys rollover and the method thereof comprising steps of:
   a. adapting a descriptor to a bit map, in which each bit of a byte presenting a key and a byte presenting eight keys, whereby rearranging said keys through sets of bytes; and
   b. placing each key of a redefined USB key-area on a position where no key ghosting being located to prevent a ghost key condition.

11. The method as claimed in claim 10, wherein, a diode is serially connected to each key to render said entire keyboard to simultaneously output said N-keys rollover.

* * * * *